United States Patent
Koeda

(10) Patent No.: US 11,619,652 B2
(45) Date of Patent: Apr. 4, 2023

(54) INSPECTION SOCKET

(71) Applicant: UNITECHNO Inc., Tokyo (JP)

(72) Inventor: Ryoichi Koeda, Tokyo (JP)

(73) Assignee: UNITECHNO Inc., Tokyo (JP)

( * ) Notice: Subject to any disclaimer, the term of this patent is extended or adjusted under 35 U.S.C. 154(b) by 169 days.

(21) Appl. No.: 17/289,678

(22) PCT Filed: Oct. 31, 2018

(86) PCT No.: PCT/JP2018/040501
§ 371 (c)(1),
(2) Date: Apr. 28, 2021

(87) PCT Pub. No.: WO2020/090031
PCT Pub. Date: May 7, 2020

(65) Prior Publication Data
US 2021/0405087 A1  Dec. 30, 2021

(51) Int. Cl.
*G01R 1/04* (2006.01)

(52) U.S. Cl.
CPC .................. *G01R 1/0466* (2013.01)

(58) Field of Classification Search
CPC .................................. G01R 1/0466
See application file for complete search history.

(56) References Cited

U.S. PATENT DOCUMENTS

2004/0077200 A1* 4/2004 Ishikawa ............... G01R 31/01
                                                       439/190
2019/0204378 A1* 7/2019 Gopal ............... G01R 31/2874

FOREIGN PATENT DOCUMENTS

| JP | 2001-281300 A | 10/2001 |
|----|---------------|---------|
| JP | 2002-181887 A | 6/2002 |
| JP | 2002-372567 A | 12/2002 |
| JP | 2006-220627 A | 8/2006 |
| JP | 2008-304254 A | 12/2008 |
| JP | 2011-112552 A | 6/2011 |
| JP | 2012-207994 A | 10/2012 |
| JP | 2013-002953 A | 1/2013 |
| JP | 2013-254812 A | 12/2013 |

OTHER PUBLICATIONS

International Search Report for International Patent Application No. PCT/JP2018/040501, dated Jan. 29, 2019 in 4 pages including English translation.

* cited by examiner

*Primary Examiner* — Paresh Patel
(74) *Attorney, Agent, or Firm* — Knobbe, Martens, Olson & Bear, LLP

(57) ABSTRACT

Provided is an inspection socket capable of elastically contacting the conductor with the electrode of the object to be tested and the electrode for inspection by pushing the object to be inspected toward the inspection substrate side, without adhering foreign matters or contact marks to the object to be inspected.
The inspection socket is so configured that the object to be inspected (100) is pushed toward the inspection substrate (10) without touching the object to be inspected (100), by integrally holding the object to be inspected (100) and the positioning table (20) using air pressure (negative pressure or positive pressure) and pushing the positioning table (20) by the pushing unit (50), so that the object to be inspected comes into contact with the land (11) of the inspection substrate (10) through the contact probe (30).

5 Claims, 4 Drawing Sheets

INSPECTION SOCKET

CROSS-REFERENCE TO RELATED APPLICATIONS

This application is the U.S. National Phase under 35. U.S.C. § 371 of International Application PCT/JP2018/040501, filed Oct. 31, 2018. The disclosures of the above-described application are hereby incorporated by reference in their entirety.

FIELD OF THE INVENTION

The present invention relates to an inspection socket.

BACKGROUND ART

When inspecting the electrical characteristics of an object to be inspected such as a semiconductor integrated circuit, an inspection socket provided with a contact probe (conductor) that electrically connects the object to be inspected and an inspection substrate on the measuring instrument side is used.

As a conventional inspection socket, there is known such an inspection socket that pushes the surface of the object to be inspected accommodated in the socket substrate by a pushing body, so that the contact probe, placed between the object to be inspected and the inspection substrate, is elastically contacted with the electrode on the side of the object to be tested and the electrode on the side of the inspection substrate, by compressing the coil spring provided in the contact probe (see, for example, Patent Document 1 and the like).

PATENT DOCUMENT

[Patent Document 1] Japanese Patent Application Publication No. 2012-207994

SUMMARY OF INVENTION

Technical Problems

By the way, in recent years, there have been increasing number of semiconductor integrated circuits having a protective cover made of glass, transparent resin, or the like that transmits an input optical signal on the surface side, as typified by a solid-state image sensor or the like. When such a semiconductor integrated circuit is inspected by the conventional inspection socket, the protective cover is directly pushed by the pushing body. However, if the push body is brought into contact with the protective cover and pushed, foreign matters or contact marks may adhere to the protective cover, and if foreign matters or contact marks is adhere to the protective cover, the sensitivity of the input optical signal decreases. Therefore, it is not appropriate to use a conventional inspection socket.

The present invention has been made in view of the above circumstances, and it is the object of the present invention to provide an inspection socket capable of elastically contacting the conductor with the electrode of the object to be tested and the electrode for inspection by pushing the object to be tested toward the side of the inspection substrate, without adhering foreign matters or contact marks to the object to be inspected.

Means to Solve the Problems

The inspection socket according to the present invention comprises: an inspection substrate having an inspection electrode; a positioning portion provided so as to be detachably opposed to the inspection substrate, and having a placement portion on which an object to be inspected having an electrode is placed so that the object to be tested opposes to the inspection substrate, on a surface opposite to the inspection substrate; a rod-shaped contact probe arranged between an electrode of the object to be inspected placed on the placement portion and the inspection electrode, and elastically contacts with the electrode of the object to be inspected and the inspection electrode; a pushing unit that pushes and moves the positioning portion toward the inspection substrate side; and a holding unit, which is different from the pushing unit, that integrally holds the object to be inspected and the positioning portion by pushing the object to be inspected against the placement portion of the positioning portion by air pressure, wherein the inspection socket is so configured that the contact prove elastically contacts the electrode of the object to be inspected and the inspection electrode, by pushing and moving the positioning portion toward the inspection substrate side by the pushing unit in a state that the object to be inspected and the positioning portion are integrally held by the holding unit.

In the present invention, by pushing the positioning portion, the object to be inspected is pushed toward the inspection substrate side, so that the conductor is brought into an elastic contact with the electrode of the object to be inspected and the electrode for inspection. According to the present invention, since the object to be inspected can be pushed toward the inspection substrate side without directly pushing the object to be inspected, the electrical characteristics of the object to be inspected can be inspected without adhering foreign matters or contact marks to the object to be inspected. Therefore, the inspection socket of the present invention can suitably inspect the electrical characteristics of a semiconductor integrated circuit or the like having a protective cover made of glass, transparent resin, or the like on the surface side.

In the present invention, the holding unit is provided with a first airtight space formation unit that forms a first airtight space on the inspection substrate side opposite to the placement portion of the positioning portion and a negative pressure generation unit that makes the first airtight space a negative pressure, and is configured to suck the object to be inspected to the inspection substrate side to push the object to be inspected against the placement portion by making the first airtight space the negative pressure by the negative pressure generation unit.

By this configuration, the object to be inspected and the positioning portion can be integrally held by making the first airtight space negative pressure, and by pushing the positioning portion in this state, the object to be inspected is pushed toward the inspection substrate side, so that the conductor can be brought into an elastic contact with the electrode of the object to be inspected and the electrode for inspection.

Further, in the present invention, the first airtight space formation unit has a first seal member that keeps a space between the placement portion of the positioning portion and the object to be inspected airtight, and a second seal member that keeps a space between the positioning portion and the inspection substrate airtight.

By this configuration, the first airtight space can be easily formed by the first seal member and the second sealing member.

Further, in the present invention, the holding unit is provided with a second airtight space formation unit that forms a second airtight space on the placement portion side of the positioning portion and a positive pressure generation unit that makes the second airtight space a positive pressure and is configured to push the object to be inspected against the placement portion by making the second airtight space the positive pressure by the positive pressure generation unit.

By this configuration, the object to be inspected and the positioning portion can be integrally held by making the second airtight space positive pressure, and by pushing the positioning portion in this state, the object to be inspected is pushed toward the inspection substrate side, so that the conductor can be brought into an elastic contact with the electrode of the object to be inspected and the electrode for inspection.

In the present invention, the second airtight space formation unit has a seal plate provided on the placement portion side of the positioning portion, a third seal member that keeps a space between the placement portion of the positioning portion and the object to be inspected airtight, and a fourth seal member that keeps a space between the seal plate and positioning portion airtight.

By this configuration, the second airtight space can be easily formed by the sealing plate, the third sealing member, and the fourth sealing member.

Effect of the Invention

According to the present invention, it is possible to provide an inspection socket capable of elastically contacting the conductor with the electrode of the object to be tested and the electrode for inspection by pushing the object to be tested toward the side of the inspection substrate, without adhering foreign matters or contact marks to the object to be inspected.

DETAILED DESCRIPTION OF EMBODIMENTS

First Embodiment

Hereinafter, the first embodiment of the present invention will be described with reference to the drawings.

First, the configuration will be described.

Figure 1:
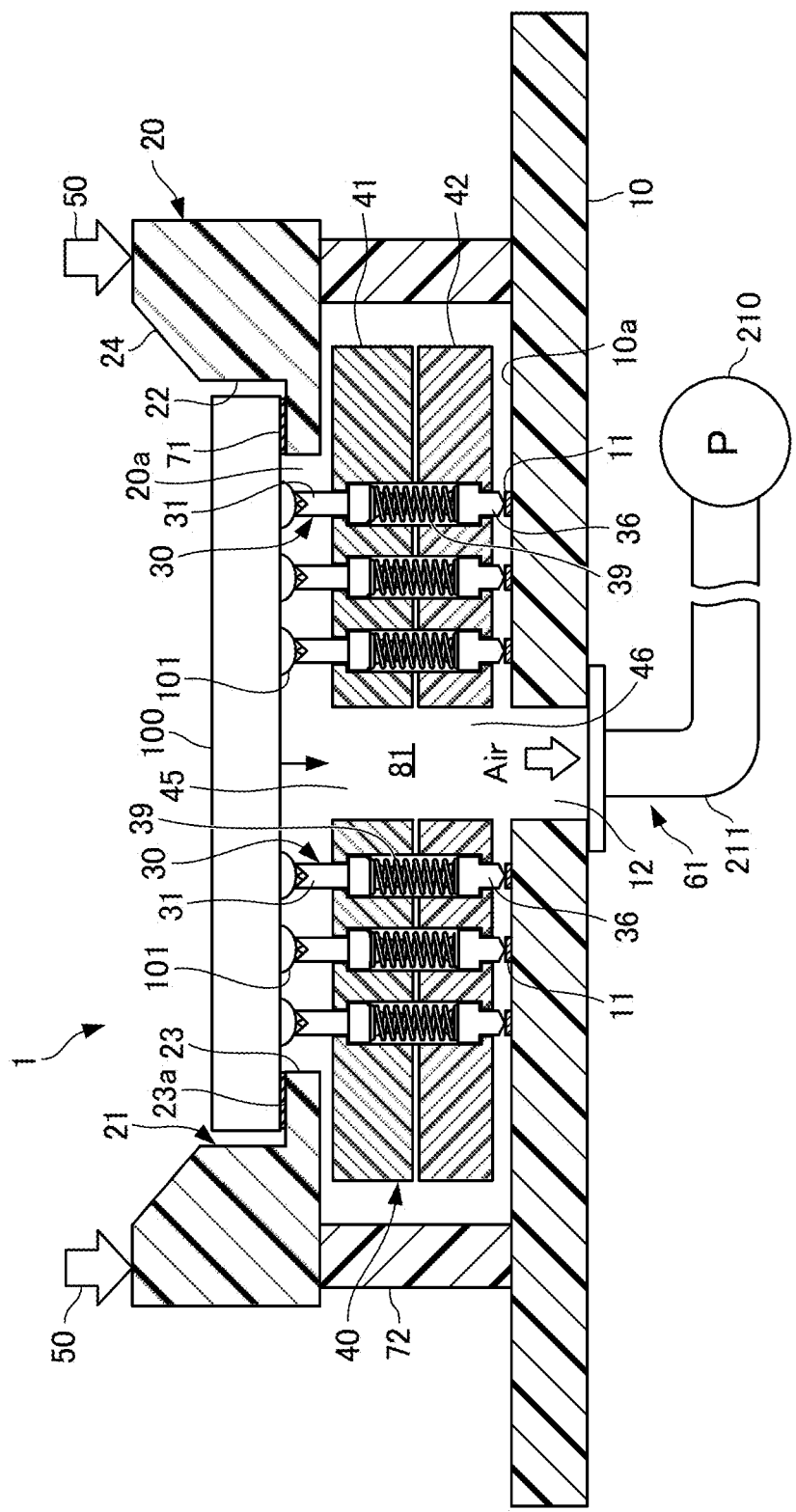
FIG. 1 is a cross-sectional view of an inspection socket according to a first embodiment of the present invention.

FIG. 1 shows the inspection socket 1 according to the first embodiment. The inspection socket 1 is provided with: an inspection substrate 10 having a plurality of lands 11; a positioning table 20 provided so as to be detachably opposed to the inspection substrate 10 and having a placement portion 23a on which an object to be inspected 100 is placed; a plurality of contact probes 30 arranged between an electrode 101 of the object to be inspected 100 placed on the placement portion 23a and the land 11 of the inspection substrate 10, and elastically contacts with these electrode 101 and the land 11; a housing 40 that collectively supports a plurality of contact probes 30; a pushing unit 50 that pushes the positioning table 20 toward the inspection substrate 10; and a holding unit 61 that integrally holds the object to be inspected 100 and the positioning table 20 by pushing the object to be inspected 100 against the placement portion 23a of the positioning table 20 by air pressure.

In the present embodiment, the land 11 constitutes the inspection electrode of the present invention, and the positioning table 20 constitutes the positioning portion of the present invention. Further, the contact probe 30 constitutes the conductor of the present invention.

The inspection substrate 10 is, for example, a printed wiring board, and is horizontally installed on, for example, a predetermined inspection table (not shown). The inspection substrate 10 has a plurality of lands 11 on its upper surface 10a. Wiring from an electric current supply circuit, a voltage measurement circuit, or the like (not shown) is connected to the inspection substrate 10.

In FIG. 1, a housing 40 that supports a plurality of contact probes 30 is installed on the upper side of the inspection substrate 10. The contact probe 30 has a rod shape extending in the vertical direction, and as will be described later, the first contact portion 31A at the upper end contacts the electrode 101 of the object to be inspected 100, and the second contact portion 36A at the lower end contacts the land 11 of the substrate 10.

Further, on the upper surface 10a of the inspection substrate 10, a second sealing member 72 having a rectangular frame shape surrounding the housing 40 is provided. The second sealing member 72 is made of an elastic body such as resin or rubber. The second sealing member 72 airtightly holds between the inspection substrate 10 and the positioning table 20.

The positioning table 20 is provided in a substantially horizontal state above the inspection substrate 10 through the second seal member 72. The positioning table 20 is detachably provided on the second seal member 72.

Since the second seal member 72 has elasticity, when the positioning table 20 is pushed toward the lower inspection substrate 10 by the pushing unit 50, the second seal member 72 is compressed, so that the positioning table 20 can be lowered to some extent. This means that the positioning table 20 is provided on the second seal member 72 so as to be vertically movable and detachable from the inspection substrate 10.

The positioning table 20 is composed of a rectangular frame-shaped member having a rectangular opening 20a formed inside thereof. An inner surface 21 around the opening 20a of the positioning table 20 has an inner wall portion 22 in the middle in the vertical direction. Further, the inner surface 21 of the positioning table 20 has a protruding portion 23 formed in a rectangular brim shape toward the inside (opening 20a side) on the lower side of the inner wall portion 22. The upper surface of the protruding portion 23 is a surface opposite to the inspection substrate 10 arranged below the positioning table 20, and constitutes the placement portion 23a.

Further, the inner surface 21 of the positioning table 20 has a guide portion 24 formed of an inclined surface having a downward slope toward the inside on the upper side of the inner wall portion 22. The outer peripheral portion of the object to be inspected 100 is placed on the placement portion 23a of the positioning table 20, so that the object to be inspected 100 is set to face the inspection substrate 10 substantially in parallel. The height of the inner wall portion 22 has the same dimensions as the thickness of the object to be inspected 100.

The object to be inspected 100 is a semiconductor integrated circuit or the like having a rectangular substrate. The object to be inspected 100 has a plurality of electrodes 101 made of solder balls on one side thereof. The object to be inspected 100 is guided by the guide portion 24 of the positioning table 20 and dropped onto the placement portion 23a with the surface on the electrode 101 side facing the lower inspection substrate 10, so as to be placed on the placement portion 23a. The object to be inspected 100 placed on the placement portion 23a is positioned so that each electrode 101 comes in contact with each contact probe 30.

The placement portion 23a of the positioning table 20 is provided with a first seal member 71 over the entire circumference thereof. The first seal member 71 is made of resin, rubber, or the like, and is provided on the placement portion 23a by means of adhesion, sticking, or the like. The first seal member 71 keeps a space between the placement portion 23a and the object to be inspected 100 airtight.

The housing 40 that supports the plurality of contact probes 30 has a configuration in which a first housing portion 41 and a second housing portion 42 formed in a plate shape by an electrically insulating material such as resin are laminated. The first housing portion 41 is arranged on the inspection body 100 side, and the second housing portion 42 is arranged on the inspection substrate 10 side. The first housing portion 41 and the second housing portion 42 are fixed to each other by fastening members such as screws (not shown), and are provided substantially parallel to the inspection substrate 10.

Figure 2:
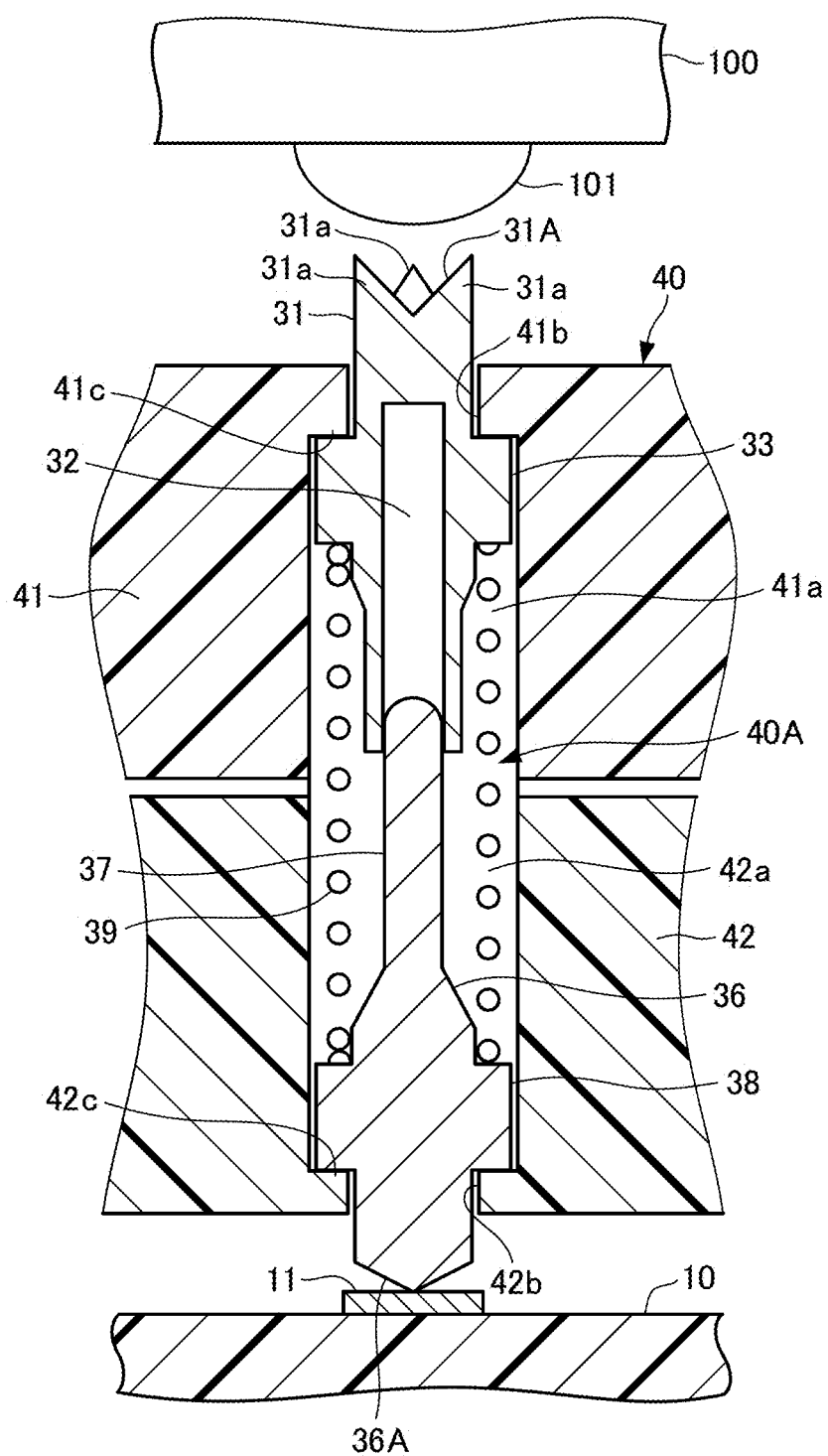
FIG. 2 is a cross-sectional view illustrating a contact probe of an inspection socket according to the first embodiment, illustrating a state before use for inspecting an object to be inspected.

As shown in FIG. 2, each contact probe 30 is housed in a plurality of housing portions 40A formed in the housing 40 and respectively supported by the housing 40. The housing portion 40A is constituted by a pair of upper and lower through holes 41a and 42a, which are formed through the first housing portion 41 and the second housing portion 42 so as to be coaxially continuous with each other.

The through hole 41a of the first housing portion 41 has an opening 41b at the end on the side to the object to be inspected 100, and an annular convex portion 41c is formed on the edge of the opening 41b. Further, the through hole 42a of the second housing portion 42 has an opening 42b at the end on the inspection substrate 10 side, and an annular convex portion 42c is formed at the edge of the opening 42b.

As shown in FIG. 2, the contact probe 30 includes a cylinder 31 housed on the first housing portion 41 side, a plunger 36 housed on the second housing portion 42 side, and a coil spring 39, which urges the cylinder 3 1and a plunger 36 in a direction to space apart from each other. The cylinder 31, the plunger 36, and the coil spring 39 are all made of a conductive metal.

The cylinder 31 is formed at the end on the side of the object to be inspected 100, and has a first contact portion 31A that contacts the electrode 101 of the object to be inspected 100. The first contact portion 31A has a plurality of sharp protrusions 31a arranged in the circumferential direction, and the electrode 101 of the object to be inspected 100 is configured to come into contact with the inside of these protrusions 31a.

Further, the cylinder 31 has a guide hole 32 that opens on the inspection substrate 10 side, and a flange portion 33 that is formed on the outer peripheral portion in the middle in the axial direction and in which the upper end of the coil spring 39 engages.

The cylinder 31 is housed in the housing portion 40A of the housing 40 so that the flange portion 33 can engage with the annular convex portion 41c of the first housing portion 41 to be moved along its own axial direction, that is, the vertical direction. When the flange portion 33 of the cylinder 31 engages with the annular convex portion 41c, the first contact portion 31A protrudes from the opening 41b of the first housing portion 41 toward the object to be inspected 100 above.

The plunger 36 has a second contact portion 36A formed in a conical shape at the end portion on the inspection substrate 10 side and the tip thereof contacts the land 11 of the inspection substrate 10. Further, the plunger 36 has a pin portion 37 that is slidably received by the guide hole 32 of the cylinder 31 and a flange portion 38 that is formed on the outer peripheral portion between the pin portion 37 and the second contact portion 36A, so that the lower end of the coil spring 39 engages.

In the plunger 36, the pin portion 37 is received by the guide hole 32 of the cylinder 31 in the housing portion 40A of the housing 40, and the flange portion 38 can be engaged with the annular convex portion 42c of the second housing portion 42. Further, the plunger 36 is stored so as to be movable along its own axial direction, that is, the vertical direction. When the flange portion 38 of the plunger 36 engages with the annular convex portion 42c, the second contact portion 36A projects from the opening 42b of the second housing portion 42 toward the inspection substrate 10 below.

In a compressed state, the upper end of the coil spring 39 is engaged with the flange portion 33 of the cylinder 31, and the lower end thereof is engaged with the flange portion 38 of the plunger 36, so that the coil spring 39 urges the cylinder 31 and the plunger 36 in a direction to space apart from each other. As a result, the contact probe 30 is usually housed in the housing portion 40A in a state that the flange portion 33 of the cylinder 31 is engaged with the annular convex portion 41c and the flange portion 38 of the plunger 36 is engaged with the annular convex portion 42c.

Figure 3:
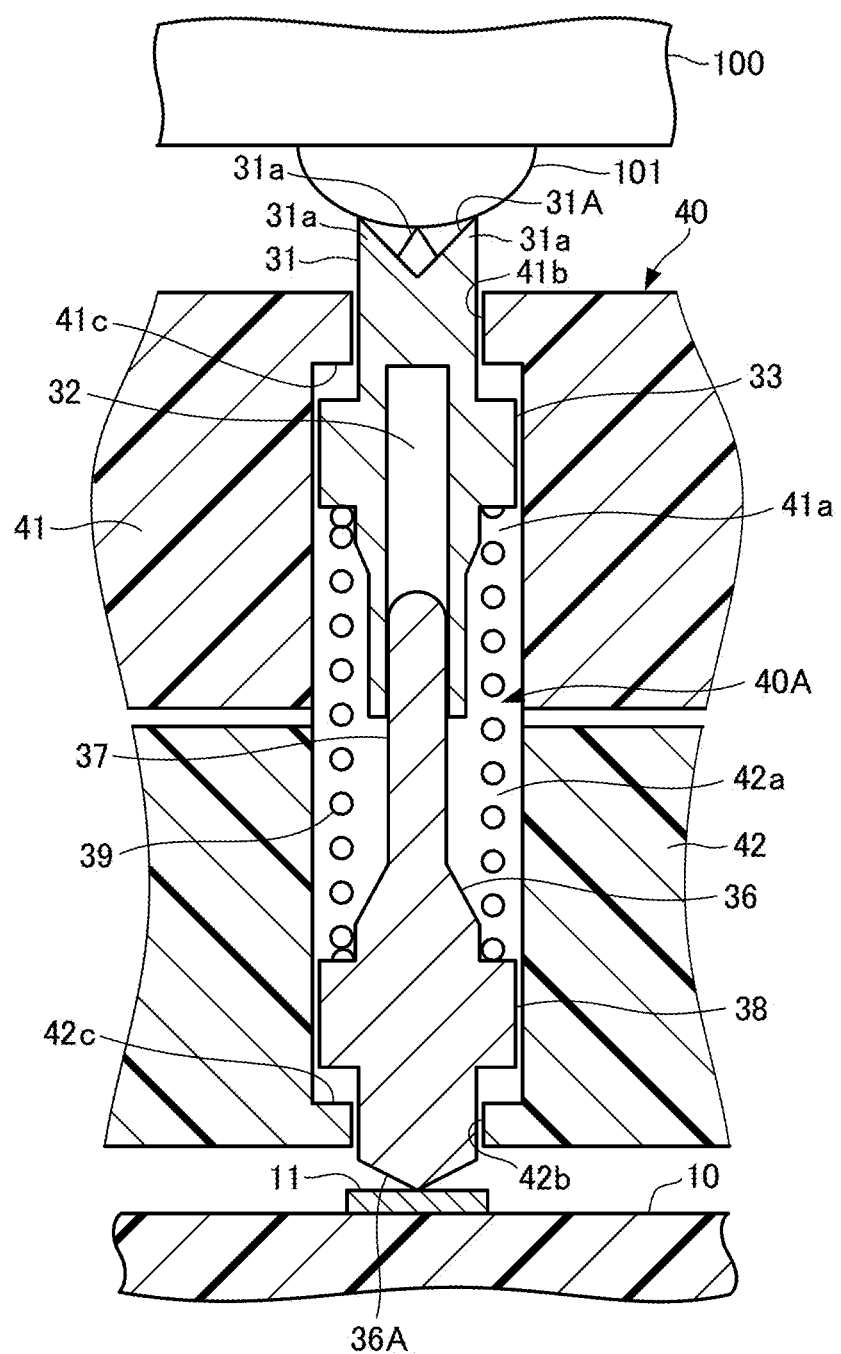
FIG. 3 is a cross-sectional view illustrating a contact probe of an inspection socket according to the first embodiment, illustrating a state in use inspecting an object to be inspected.

The contact probe 30 of the present embodiment is inspected in a state where the first contact portion 31A is in contact with the electrode 101 of the object to be inspected 100 and the second contact portion 36A is in contact with the land 11 of the inspection substrate 10. When the object to be inspected 100 is lowered toward the inspection substrate 10, as shown in FIG. 3, the pin portion 37 of the plunger 36 slides relative to the guide hole 32 of the cylinder 31, whereby the plunger 36 and the cylinder 31 relatively approach each other.

At this time, since the coil spring 39 is compressed, the cylinder 31 and the plunger 36 are urged so as to be spaced apart from each other, so that the first contact portion 31A and the second contact portion 36 are brought into an elastic contact with the electrode 101 of the object to be inspected 100 and the land 11 of the inspection substrate 10, respectively, with an appropriate contact pressure. As a result, the electrode 101 of the object to be inspected 100 and the land 11 of the inspection substrate 10 are electrically connected through the contact probe 30.

It should be noted that the contact probe 30 is an example of the conductor of the present invention, and the conductor of the present invention is not limited to the configuration of the contact probe 30, but any configuration can be applied as long as it is so configured to elastically contact with the electrode 101 of the object to be inspected 100 and the land 11 of the inspection substrate 10 to enable electrical connection.

As shown in FIG. 1, a hole 12 is formed in the central portion of the inspection substrate 10. Further, holes 45 and 46 are formed at positions above the holes 12 of the housing portions 41 and 42 of the housing 40, respectively.

In the present embodiment, a space in the inspection socket 1 in which the housing 40 is housed, which is a space surrounded by the inspection substrate 10, the second seal member 72, the positioning table 20, and the object to be inspected 100 set on the positioning table 20, is formed as the first airtight space 81. The first airtight space 81 is so configured to be kept airtight by the first seal member 71 that keeps a space between the placement portion 23a of the positioning table 20 and the object to be inspected 100 airtight and the second seal member 72 that keeps the space between the inspection substrate 10 and the positioning table 20 airtight. The first seal member 71 and the second seal member 72 constitute the first airtight space forming unit of the present invention.

A suction pump 210 that sucks air from the first airtight space 81 from the hole 12 through the suction pipe 211 and makes the first airtight space 81 negative pressure is connected to the inspection board 10. The suction pump 210 constitutes the negative pressure generating unit of the present invention.

When the suction pump 210 is operated, the first airtight space 81 becomes a negative pressure, so that the object to be inspected 100 is sucked toward the inspection substrate 10 side, pushed against the mounting portion 23a of the positioning table 20, and adheres to the first seal member 71 airtightly. As a result, the object to be inspected 100 and the positioning table 20 are integrally held.

In the present embodiment, the suction pump 210, the first seal member 71, and the second seal member 72 collectively constitute the holding unit 61 that integrally holds the object to be inspected 100 and the positioning table 20, by pushing the object to be inspected 100 against the placement portion 23a of the positioning table 20 by air pressure (negative pressure).

Next, the operation will be explained.

In the inspection socket 1 according to the first embodiment, the object to be inspected 100 and the positioning table 20 are integrally held as described above, by operating the suction pump 210 to make the first airtight space 81 a negative pressure.

In this state, the positioning table 20 is lowered by being pushed downward by the pushing unit 50. Then, as shown in FIG. 3, each contact probe 30 receives a load from the object to be inspected 100, so that the coil spring 39 is compressed, thereby bringing the first contact portion 31A and the second contact portion 36A into an elastic contact with the electrode 101 of the object to be inspected 100 and the land 11 of the inspection substrate 10, respectively, with an appropriate contact pressure. As a result, the electrode 101 of the object to be inspected 100 and the land 11 of the inspection substrate 10 are electrically connected through the contact probe 30, thereby making it possible to inspect the electrical characteristics of the object to be inspected 100.

In this state of use, the object to be inspected 100 receives, from the contact probe 30, an elastic force in a direction to be spaced apart from the placement portion 23a of the positioning table 20. Therefore, the electrode 101 of the object to be inspected 100 can be stably brought into contact with the contact probe 30, by controlling the pressure (negative pressure) in the first airtight space 81 so that a state in which the object to be inspected 100 is sucked to the placement portion 23a against this elastic force is obtained.

The inspection socket 1 of the present embodiment can push the object to be inspected 100 toward the inspection substrate 10 side without directly pushing the exposed surface of the object to be inspected 100 set on the positioning table 20 by pushing the positioning table 20 by the pushing unit 50. Therefore, the electrical characteristics of the object to be inspected 100 can be inspected without adhering foreign matters or contact marks to the object to be inspected 100.

Therefore, the inspection socket 1 of the present embodiment can suitably inspect the electrical characteristics of the object to be inspected 100, even if the object to be inspected 100 has a protective cover or the like made of glass, transparent resin, or the like on the surface side thereof in a state of being set on the positioning table 20.

Further, according to the present embodiment, the first airtight space 81 can be easily formed by the first seal member 71 and the second seal member 72.

It should be noted that although the first seal member 71 and the second seal member 72 constitute the first airtight space forming unit for keeping the first airtight space 81 airtight in the first embodiment, the airtight space forming unit is not limited to these seal members 71 and 72, but may be of any configuration as long as it can keep the first airtight space 81 airtight.

Second Embodiment

Next, the second embodiment of the present invention will be described with reference to FIG. 4.

The second embodiment is different from the first embodiment in that the object to be inspected 100 is integrally held with the positioning table 20 by a positive pressure. In the following description, the same components as those in the first embodiment are designated by the same reference numerals, and the differences from the first embodiment will be mainly described.

Figure 4:
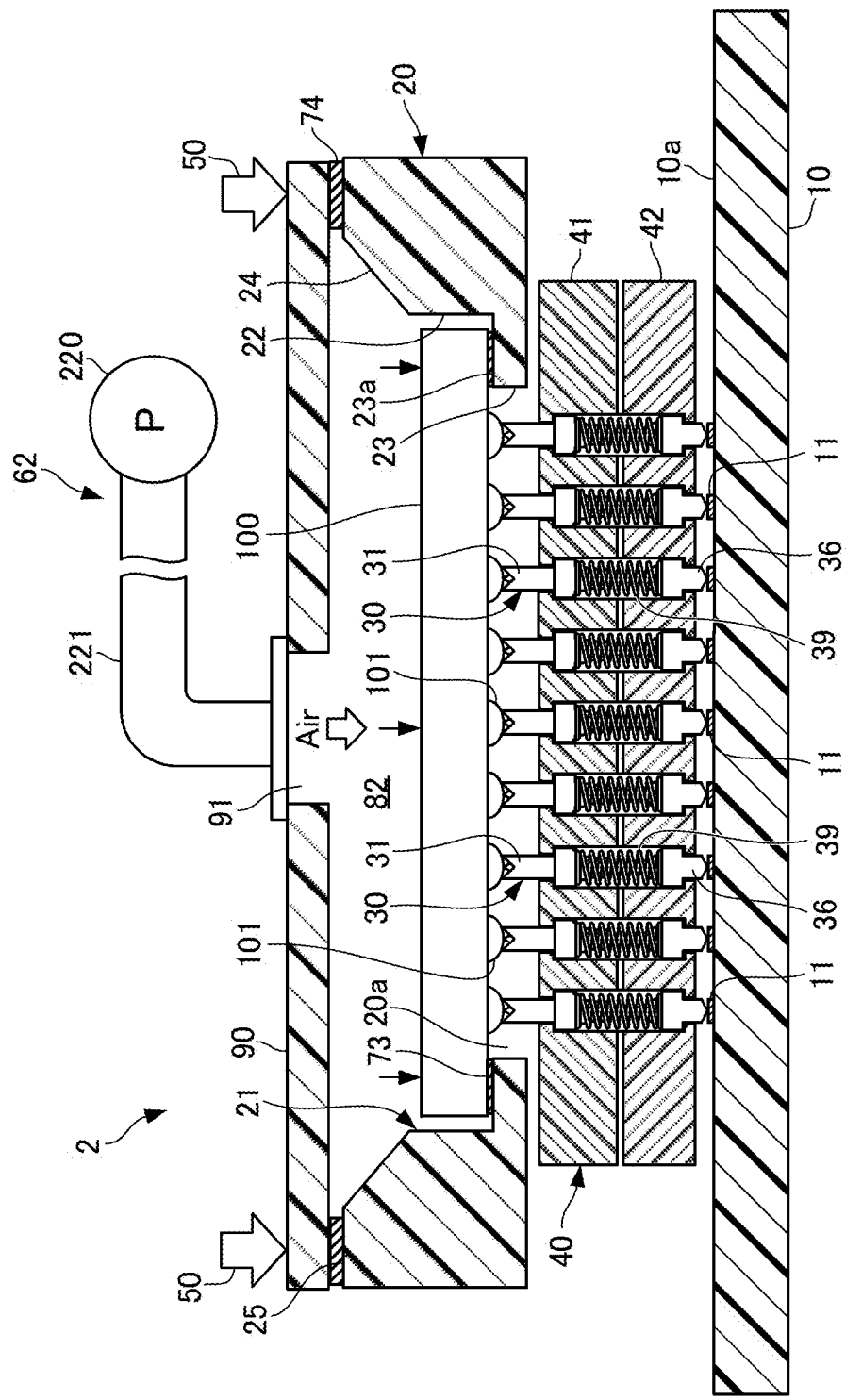
FIG. 4 is a cross-sectional view of an inspection socket according to a second embodiment of the present invention.

First, in the inspection socket 2 according to the second embodiment shown in FIG. 4, the holes 12 of the inspection board 10 and the holes 45 and 46 of the housing 40 are not formed. Further, the inspection socket 2 of the second embodiment does not have the second seal member 72, and has a third seal member 73 instead of the first seal member 71.

As shown in FIG. 4, the inspection socket 2 according to the second embodiment has: a sealing plate 90 arranged on the upper side of the positioning table 20, that is, on the side of the placement portion 23a of the positioning table 20 and covered with the positioning table 20; a third sealing member 73 that keeps the space between the placement portion 23a and the object to be inspected 100 airtight, and a fourth sealing member 74 that keeps a space between the sealing plate 90 and the positioning table 20 airtight.

The third seal member 73 is the same as the first seal member 71 of the first embodiment, is made of resin, rubber, or the like, and is provided with means of adhesion, sticking or the like over the entire circumference of the placement portion 23a.

The fourth seal member 74 is provided on the upper surface 25 of the positioning table 20 over the entire circumference. Like the third seal member 73, the fourth seal member 74 is also made of resin, rubber, or the like, and is provided with means of adhesion, sticking or the like on the upper surface 25 of the positioning table 20.

The sealing plate 90 is detachably provided on the upper surface 25 of the positioning table 20 through the fourth sealing member 74. The material of the sealing plate 90 is not limited, but is made of, for example, resin, metal, or the like, and is constituted by a plate material having a certain degree of rigidity. A hole 91 is formed in a central portion of the sealing plate 90.

In the second embodiment, the second airtight space 82 surrounded by the positioning table 20, the object to be inspected 100 set on the positioning table 20, and the sealing plate 90 is formed above the positioning table 20, which is, on the placement portion 23*a* side. The second airtight space 82 is configured to be kept airtight by the third sealing member 73 that keeps a space between the placement portion 23*a* of the positioning table 20 and the object to be tested 100 airtight, and the fourth sealing member 74 that keeps a space between an upper surface 25 of the positioning table 20 and the sealing plate 90 airtight. The third seal member 73 and the fourth seal member 74 constitute the second airtight space forming unit of the present invention.

A pressure feed pump 220 is connected to the sealing plate 90 by pumping air from the hole 91 into the second airtight space 82 through the pumping pipe 221 to make the second airtight space 82 a positive pressure. The pressure feed pump 220 constitutes the positive pressure generating unit of the present invention.

When the pressure feed pump 220 is operated, the second airtight space 82 becomes a positive pressure, whereby the object to be inspected 100 is pushed against the placement portion 23*a* and airtightly adheres to the third seal member 73. As a result, the object to be inspected 100 and the positioning table 20 are integrally held.

In the second embodiment, the pressure feed pump 220, the third seal member 73, and the fourth seal member 74 are constituting the holding unit 62 according to the second embodiment, which is the holding unit 62 that integrally holds the object to be inspected 100 and the positioning table 20 by pushing the object to be inspected 100 against the placement portion 23*a* of the positioning table 20 by air pressure (positive pressure).

The inspection socket 2 of the second embodiment can integrally hold the object to be inspected 100 and the positioning table 20 by operating the pressure feed pump 220 to make the second airtight space 82 a positive pressure. In this state, the positioning table 20 is pushed downward by the pushing unit 50 and is lowered, so that the contact portions 31A and 36A of each contact probe 30 are brought into an elastic contact with the electrode 101 of the object to be inspected 100 and the land 11 of the inspection substrate 10, respectively.

In this used state, the object to be inspected 100 receives an elastic force in a direction to space part from the placement portion 23*a* of the positioning table 20 by the contact probe 30. Therefore, the electrode 101 of the object to be inspected 100 can be stably contacted with the contact probe 30, by controlling the pressure (positive pressure) in the second airtight space 82 so that a state in which the object to be inspected 100 is sucked to the placement portion 23*a* against this elastic force, is obtained.

In the second embodiment, as well as in the first embodiment, the object to be inspected 100 can be pushed toward the inspection substrate 10 without directly pushing the surface of the object to be inspected 100 set on the positioning table 20. Therefore, the electrical characteristics of the object to be inspected 100 can be inspected without adhering foreign matters or contact marks to the object to be inspected 100.

Further, according to the second embodiment, the second airtight space 82 can be easily formed by the sealing plate 90, the third sealing member 73, and the fourth sealing member 74.

In the second embodiment, the sealing plate 90, the third sealing member 73, and the fourth sealing member 74 constitute a second airtight space forming unit for airtightly holding the second airtight space 82. However, the second airtight space forming unit is not limited to these sealing plates 90 and the sealing members 73 and 74, and any means can hold the second airtight space 82 airtightly.

INDUSTRIAL APPLICABILITY

The inspection socket according to the present invention elastically pushed the object to be inspected against the inspection substrate side, so that the conductor is brought into an elastic contact with the electrode of the object to be inspected and the inspection electrode without adhering foreign matters or contact marks to the object to be inspected. Therefore, it is particularly useful as an inspection socket for inspecting electrical characteristics of semiconductor integrated circuits and the like having a protective cover made of glass, transparent resin, or the like on the surface side.

INDUSTRIAL APPLICABILITY

Explanation of Reference Numerals

1,2 Inspection Socket
10 Inspection Substrate
11 Land (Inspection Electrode)
20 Positioning Table (Positioning Portion)
23*a* Placement Portion
30 Contact Probe (Conductor)
50 Pushing Unit
61,62 Holding Unit
71 First Seal Material (First Airtight Space Formation Unit)
72 Second Seal Member (First Airtight Space Formation Unit)
73 Third Seal Member (Second Airtight Space Formation Unit)
74 Fourth Seal Member (Second Airtight Space Formation Unit)
81 First Airtight Space
82 Second Airtight Space
90 Sealing Plate (Second Airtight Space Formation Unit)
100 Object To Be Inspected
101 Electrode Of Object To Be Inspected
210 Suction Pump (Negative Pressure Generation Unit)
220 Pressure Feed Pump (Positive Pressure Generation Unit)

What is claimed is:

1. An inspection socket, comprising:
   an inspection substrate having an inspection electrode;
   a positioning portion provided so as to be detachably opposed to the inspection substrate, and having a placement portion on which an object to be inspected having an electrode is placed so that the object to be tested opposes to the inspection substrate, on a surface opposite to the inspection substrate;
   a rod-shaped contact probe arranged between the electrode of the object to be inspected placed on the placement portion and the inspection electrode, and elastically contacts with the electrode of the object to be inspected and the inspection electrode;

a pushing unit that pushes and moves the positioning portion toward the inspection substrate side; and a holding unit, which is different from the pushing unit, that integrally holds the object to be inspected and the positioning portion by pushing the object to be inspected against the placement portion of the positioning portion by air pressure, wherein the inspection socket is so configured that the contact probe elastically contacts the electrode of the object to be inspected and the inspection electrode, by pushing and moving the positioning portion toward the inspection substrate side by the pushing unit in a state that the object to be inspected and the positioning portion are integrally held by the holding unit.

2. The inspection socket according to claim 1, wherein the holding unit is provided with a first airtight space formation unit that forms a first airtight space on the inspection substrate side opposite to the placement portion of the positioning portion and a negative pressure generation unit that makes the first airtight space a negative pressure and is configured to suck the object to be inspected to the inspection substrate side to push the object to be inspected against the placement portion by making the first airtight space the negative pressure by the negative pressure generation unit.

3. The inspection socket according to claim 2, wherein the first airtight space formation unit has a first seal member that keeps a space between the placement portion of the positioning portion and the object to be inspected airtight, and a second seal member that keeps a space between the positioning portion and the inspection substrate airtight.

4. The inspection socket according to claim 1, wherein the holding unit is provided with a second airtight space formation unit that forms a second airtight space on the placement portion side of the positioning portion and a positive pressure generation unit that makes the second airtight space a positive pressure, and is configured to push the object to be inspected against the placement portion by making the second airtight space the positive pressure by the positive pressure generation unit.

5. The inspection socket according to claim 4, wherein the second airtight space formation unit has a seal plate provided on the placement portion side of the positioning portion, a third seal member that keeps a space between the placement portion of the positioning portion and the object to be inspected airtight, and a fourth seal member that keeps a space between the seal plate and positioning portion airtight.

* * * * *